(12) United States Patent
Chen et al.

(10) Patent No.: US 12,421,619 B2
(45) Date of Patent: Sep. 23, 2025

(54) METHOD FOR SUPPLEMENTARY DOPING OF MONOCRYSTALLINE SILICON BY LOWERING A DEVICE COMPRISING A CONTAINING MEMBER PROVIDED WITH FIRST AND SECOND THROUGH-HOLES

(71) Applicant: TCL ZHONGHUAN RENEWABLE ENERGY TECHNOLOGY CO., LTD., Tianjin (CN)

(72) Inventors: Jiajun Chen, Tianjin (CN); Ruolin Wu, Tianjin (CN); Yonggang Nie, Tianjin (CN); Libo Cheng, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 18/007,486

(22) PCT Filed: Nov. 25, 2022

(86) PCT No.: PCT/CN2022/134263
§ 371 (c)(1),
(2) Date: Jan. 31, 2023

(87) PCT Pub. No.: WO2023/098580
PCT Pub. Date: Jun. 8, 2023

(65) Prior Publication Data
US 2024/0271316 A1 Aug. 15, 2024

(30) Foreign Application Priority Data
Nov. 30, 2021 (CN) .......................... 202111448075.2

(51) Int. Cl.
*C30B 15/04* (2006.01)
*C30B 29/06* (2006.01)

(52) U.S. Cl.
CPC .............. *C30B 15/04* (2013.01); *C30B 29/06* (2013.01)

(58) Field of Classification Search
CPC ......... C30B 15/00; C30B 15/02; C30B 15/04; C30B 15/20; C30B 29/00; C30B 29/02; C30B 29/06
(Continued)

(56) References Cited

U.S. PATENT DOCUMENTS 5,406,905 A * 4/1995 Yemane-Berhane ... C30B 29/06
117/911
6,059,876 A * 5/2000 Yin .......................... C30B 29/06
117/214
(Continued)

FOREIGN PATENT DOCUMENTS

CN    103958745 A *  7/2014  ............. C30B 15/04
CN    216919477 U     7/2022

OTHER PUBLICATIONS

International Search Report in International application No. PCT/CN2022/134263, mailed on Jan. 18, 2023.
(Continued)

*Primary Examiner* — Kenneth A Bratland, Jr.
(74) *Attorney, Agent, or Firm* — PV IP PC; Wei Te Chung

(57) ABSTRACT

A method for supplementary doping of monocrystalline silicon by lowering a device comprising a containing member provided with first and second through-holes are provided. The device includes a hoisting member, a connecting member, and a containing member which are arranged in sequence from top to bottom in a vertical direction, wherein the hoisting member is connected with one end of the connecting member, and another end of the connecting member is movably connected with the containing member, so that the containing member is rotatable with respect to the
(Continued)

connecting member. The containing member is provided with a first through-hole and a second through-hole, and the connecting member and the containing member are connected at a joint. A distance between the first through-hole and the joint is less than a distance between the second through-hole and the joint in the vertical direction.

6 Claims, 1 Drawing Sheet

(58) Field of Classification Search
USPC ....... 117/11, 13, 19, 21, 200, 206, 208, 214, 117/928, 931–932
See application file for complete search history.

(56) References Cited

U.S. PATENT DOCUMENTS

2001/0015167 A1* 8/2001 Weber ................... C30B 15/04
117/11
2009/0314996 A1* 12/2009 Kawazoe ............... C30B 29/06
438/510

OTHER PUBLICATIONS

Written Opinion of the International Search Authority in International application No. PCT/CN2022/134263, mailed on Jan. 18, 2023.

* cited by examiner

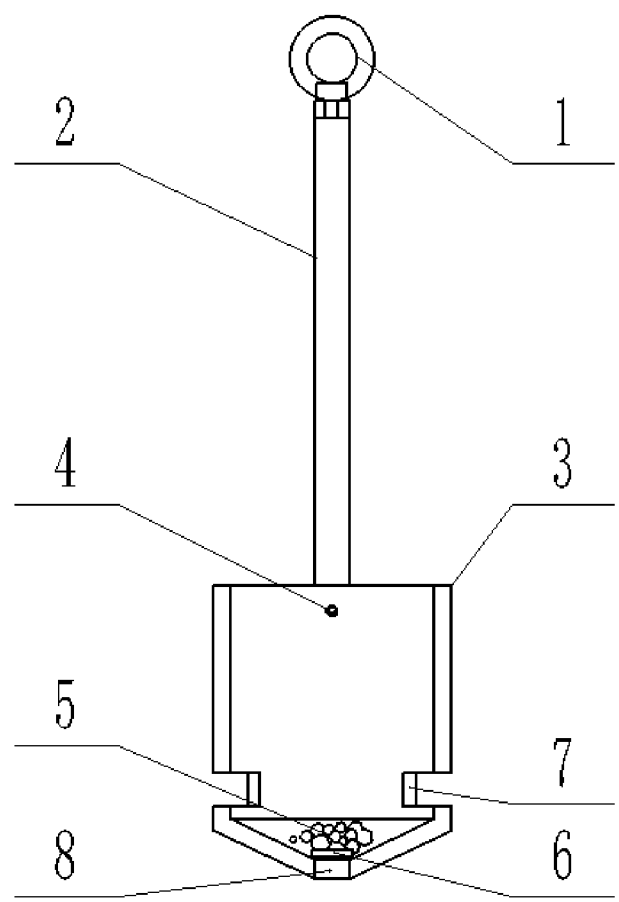

METHOD FOR SUPPLEMENTARY DOPING OF MONOCRYSTALLINE SILICON BY LOWERING A DEVICE COMPRISING A CONTAINING MEMBER PROVIDED WITH FIRST AND SECOND THROUGH-HOLES

CROSS-REFERENCE TO RELATED APPLICATION

The present disclosure claims priority to and the benefit of Chinese Patent Application No. 202111448075.2, filed on Nov. 30, 2021, the disclosure of which is incorporated herein by reference in its entirety.

TECHNICAL FIELD

The present disclosure relates to the technical field of monocrystalline silicon manufacturing, and in particular, to devices for supplementary doping of monocrystalline silicon and a method for supplementary doping of monocrystalline silicon by lowering a device comprising a containing member provided with first and second through-holes.

BACKGROUND

It is well known that solar monocrystalline silicon wafers are divided into N-type and P-type, which are used for manufacturing solar cells. The N-type monocrystalline silicon wafers use phosphorus as a doping element, which has a high cost in manufacturing solar cells than P-type silicon wafers during an actual manufacturing process. Therefore, most of enterprises in the market currently manufacture the solar cells by producing the P-type silicon wafers. The earliest doping element of the P-type monocrystalline silicon wafers is boron. However, boron can combine oxygen in the monocrystalline silicon wafers to form a boron-oxygen complex, causing boron-oxygen related light-induced degradation (BO-LID) of the solar cells, which is also considered to be the main reason for initial light-induced degradation of the monocrystalline silicon cells. After the crystalline silicon cells enter the passivated emitter rear cell (PERC) era, influence of the BO-LID becomes more apparent. With the development of monocrystalline silicon manufacturing technology, an effective method to solve light-induced degradation (LID) is to use a gallium-doped silicon wafer in which a gallium atom replaces a boron atom, thus effectively solving the problem of boron-oxygen recombination, and almost suppressing the light-induced degradation of the solar cells, so it has great development potential.

In the production of czochralski monocrystalline silicon (i.e., a silicon monocrystal with a certain size, crystal orientation, conductivity type, and resistivity range drawn from a silicon melt in a vertical direction), since gallium has a segregation coefficient (segregation coefficient=(solubility of impurities in a solid phase)/(solubility of impurities in a liquid phase)) of only 0.008, which is 100 times smaller than that of conventional boron (which has a segregation coefficient of 0.8), it is difficult to control the concentration of gallium in the doping process. As a result, the resistivity of head of the produced monocrystalline silicon varies greatly, and there is a low target resistivity hit ratio (i.e., a proportion of resistivity consistent with the target resistivity). In order to accurately control the resistivity and improve the qualified rate of effective products, some enterprises may draw a sample to measure the resistance before drawing the monocrystalline silicon, and supplement gallium element to improve the resistivity hit ratio.

At present, a method for supplementary doping gallium element on monocrystalline silicon is carried out by using a seed crystal (i.e., a small crystal with the same crystal orientation as the desired crystal, which is a seed for growing monocrystalline) to perform a reduced-power crystal expansion on the surface of silicon solution, and then lifting the crystal out of a monocrystalline furnace, placing gallium particles on the crystal, and melting the crystal and the gallium particles in the silicon solution through purification and high temperature. On the one hand, the whole supplementary doping process takes 3 to 4 hours, which seriously delays the production rhythm and affects the production efficiency. On the other hand, since gallium has a physical melting point of only 29.8° C., gallium is easily melted and lost in the process of supplementary doping and crystal expansion, so that full doping cannot be guaranteed, which has a certain influence on resistance control. Currently, on the one hand, devices for supplementary doping gallium element on monocrystalline silicon cannot be reused, and the cost is high; on the other hand, the devices have complex structures and the doping is not uniform.

SUMMARY

In view of the above problems, the present disclosure provides a device for supplementary doping of monocrystalline silicon alloy and a method for supplementary doping of monocrystalline silicon by lowering a device comprising a containing member provided with first and second through-holes, so as to solve the above problems or other problems existing in the related art.

In order to solve the above-mentioned technical problems, technical solutions adopted in the present disclosure are as follows: A device for supplementary doping, including a hoisting member, a connecting member, and a containing member disposed in sequence from top to bottom in a vertical direction, wherein the hoisting member is connected with one end of the connecting member, and another end of the connecting member is movably connected with the containing member, so that the containing member is rotatable with respect to the connecting member;

the containing member is provided with a first through-hole and a second through-hole, and the connecting member and the containing member are connected at a joint; and a distance between the first through-hole and the joint is less than a distance between the second through-hole and the joint in the vertical direction, so that the silicon solution enters the containing member from the first through-hole and carries dopants out of the containing member through the second through-hole during the supplementary doping process.

Further, an inner portion of the containing member is divided into a first accommodating cavity and a second accommodating cavity communicated with each other, an upper portion of the first through-hole is the first accommodating cavity, and a lower portion of the first through-hole is the second accommodating cavity.

Further, the device includes a blocking member through which the second through-hole is blocked.

Further, the second accommodating cavity is used for filling dopants.

Further, the containing member has a barrel structure.

Further, the containing member includes a first barrel and a second barrel, the first barrel and the second barrel are same or different, and are selected from a group comprising a sphere, a rhombus, an ellipsoid, a cone, a rounded rectangle with a length, or other shapes, preferably the second barrel is a cone.

Further, the first through-hole is located in the first barrel and the second through-hole is located in the second barrel.

Further, the containing member is provided with an opening communicated with the first accommodating cavity, so that the dopants enter the first accommodating cavity from the opening and then enter the second accommodating cavity through the first accommodating cavity for filling the dopants.

Further, the first through-hole is located on one side wall of the containing member, and the second through-hole is located at a bottom of the containing member, preferably the second through-hole is located at center of the bottom of the containing member.

Further, both the first through-hole and the second through-hole are located on one side wall of the containing member.

Further, the device for supplementary doping on the monocrystalline silicon includes a plurality of the first through-holes disposed in sequence at a same height along a circumferential direction of a side wall of the containing member.

Further, the device for supplementary doping on the monocrystalline silicon includes at least two of the first through-holes symmetrically disposed on a side wall of the containing member with respect to an axial direction of the containing member.

Further, a material of the containing member is quartz.

Further, a material of the connecting member is metal molybdenum.

In another aspect, the present disclosure also relates to a method for supplementary doping of monocrystalline silicon by lowering a device comprising a containing member provided with first and second through-holes by using the above device, including steps of:
 (1) lowering the above device for supplementary doping on the monocrystalline silicon;
 (2) controlling positions of the device for supplementary doping on the monocrystalline silicon to immerse the containing member filled with dopants in a silicon solution;
 (3) pouring the silicon solution into the containing member through the first through-hole;
 (4) melting a blocking member; and
 (5) guiding the silicon solution with the dopants flowing out of the second through-hole for supplementary doping.

When the above device for supplementary doping on the monocrystalline silicon is used for supplementary doping, it is only necessary to hang the device for supplementary doping on the monocrystalline silicon in an auxiliary room of an existing monocrystalline furnace through the hoisting member. Before supplementary doping, firstly increasing power of a heater in the monocrystalline furnace, that is, increasing a power variation on the basis of the welding power, and further increasing a distance from a draft tube to the surface of the silicon solution, that is, increasing a distance variation on the basis of the position of the draft tube before supplementary doping.

Further, the power variation ranges from 10 kw to 30 kw, and the distance variation ranges from 30 mm to 50 mm.

Further, before carrying out the step (1), blocking the second through-hole through the blocking member; filing the dopants; and hanging the device filled with the dopants.

Further, the step (1) includes lowering the device at a first speed to a first position above a surface of the silicon solution, and staying for a period of time for preheating, wherein said first position is configured for a distance between the containing member and the surface of the silicon solution ranging from 20 mm to 30 mm, the preheating is carried for 1 min to 3 min, and the first speed ranges from 500 mm/min to 700 mm/min.

Further, said controlling position of the device in the step (2) includes:

Contacting the containing member with the silicon solution when the surface of the silicon solution has a temperature greater than 1460° C., and continuing to lower the device for supplementary doping on the monocrystalline silicon until the silicon solution can flow into the containing member through the first through-hole. During said continuing to lower the device, the surface of the silicon solution is always lower than the joint of the connecting member and the containing member.

Allowing the containing member to stay in the silicon solution for a first period, so that the silicon solution enters the containing member and melts the blocking member.

After the blocking member melting, lifting the device for supplementary doping on the monocrystalline silicon, so that the dopants flow out of the second through-hole along with the silicon solution.

Repeating the above steps until there is no residue of the dopants in the containing member.

Further, the first period ranges from 30 seconds to 120 seconds.

Further, lifting the device for supplementary doping on the monocrystalline silicon and slowly cooling temperature of the containing member during the lifting process, which includes:

Lifting the device for supplementary doping on the monocrystalline silicon at a second speed for a second period to reduce the temperature of the containing member.

Lifting the device for supplementary doping on the monocrystalline silicon at a third speed for a third period to lift the device for supplementary doping on the monocrystalline silicon into the auxiliary room.

Reducing power of the heater to the welding power.

The second speed is less than the third speed.

Further, the second speed ranges from 300 mm/hr to 500 mm/hr, the second period ranges from 1 min to 2 min, the third speed ranges from 500 mm/min to 700 mm/min, and the third period ranges from 3 min to 5 min.

Further, the blocking member is silicon.

According to the above-mentioned technical solutions, the device for supplementary doping on the monocrystalline silicon is provided with a hoisting member, so that the device for supplementary doping on the monocrystalline silicon can be hung in an auxiliary room by means of a hook of a refeeder in an auxiliary room of a monocrystalline furnace, thereby reducing cost for equipment modification. The device for supplementary doping on the monocrystalline silicon is provided with a containing member for filing dopants. Meanwhile the containing member is provided with a first through-hole and a second through-hole, a connecting member is connected with the containing member at a joint. A distance between the first through-hole and the joint is less than a distance between the second through-hole and the joint in the vertical direction, so that silicon solution enters the containing member from the first through-hole and carries dopants out of the containing member through the second through-hole for supplementary doping when the device is used for supplementary doping. Further, during the supplementary doping process, temperature of the silicon solution is increased, so that the blocking member and the dopants in the device can be quickly melted, which can effectively save man-hours for supplementary doping and improve utilization rate of the effective man-hours. The material of the containing member of the device is quartz, and the material of the connecting member is metal molybdenum, so that no new impurities can be introduced, thus improving production capacity of the monocrystalline silicon, and effectively reducing the production cost simultaneously. In addition, the device can be recycled, having low investment and remarkable benefits.

BRIEF DESCRIPTION OF DRAWINGS

FIG. 1 is a schematic structural diagram of a device for supplementary doping an alloy according to an embodiment of the present disclosure.

DESCRIPTION OF REFERENCE NUMBERS

| 1: Hoisting member | 2: Connecting member | 3: Containing member |
|---|---|---|
| 4: Molybdenum bolt | 5: Dopant | 6: Blocking member |
| 7: First through-hole | 8: Second through-hole | |

DETAILED DESCRIPTION

Hereinafter, the present disclosure will be further explained with reference to the accompanying drawings and specific embodiments.

FIG. 1 is a schematic structural diagram of a device for supplementary doping according to an embodiment of the present disclosure. This embodiment relates to a device for supplementary of monocrystalline silicon alloy and a method for supplementary doping, which are used for supplementary doping dopants in the czochralski monocrystalline process.

A device for supplementary doping of monocrystalline silicon alloy, as shown in FIG. 1, includes a hoisting member 1, a connecting member 2, and a containing member 3, wherein the hoisting member 1 is connected with one end of the connecting member 2, and the other end of the connecting member 2 is movably connected with the containing member 3, so that the containing member 3 is rotatable with respect to the connecting member 2 to facilitate filling of the dopants 5. The hoisting member 1 is connected with a hook of a refeeder (a container required for repeated feeding), so as to hang the device in an auxiliary room of a monocrystalline furnace. When the dopants 5 are needed to be supplementary doped in the czochralski monocrystalline process, the device can be hung in the auxiliary room for supplementary doping of the dopants 5. In order to facilitate the connection between the hoisting member 1 and the hook of the refeeder, the hoisting member 1 may be in a hook-shaped structure, so that the hoisting member 1 can be connected with the hook of the refeeder, or the hoisting member 1 may have a hole matched with the hook, so that the hoisting member 1 can be connected with the hook. The structure of the hoisting member 1 may be selected according to actual requirements, which is not specifically limited herein. In this embodiment, the hoisting member 1 is preferably a hoisting ring, so that the hoisting member 1 can be hung on the hook of the refeeder, and the installation is convenient and fast.

As the device for supplementary doping is installed in the monocrystalline furnace for supplementary doping in the alloy, the material of the hoisting member 1 may be stainless steel, metal molybdenum, or other high-temperature-resistant materials, which can be selected according to actual requirements, and there is no specific limitations herein.

The above-mentioned connecting member 2 is used for connecting the hoisting member 1 and the containing member 3 together. The connecting member 2 has a rod-shaped structure, wherein one end of the connecting member 2 is connected with the hoisting member 1, and the other end of the connecting member is movably connected with the containing member 3. In order to keep the containing member 3 balanced without inclination when the device is hung in the auxiliary room of the monocrystalline furnace, it is preferable that two connecting members 2 are disposed symmetrically on both sides of the containing member 3, so that the containing member 3 is evenly stressed. One end of each of the plurality of connecting members 2 is movably connected with the containing member 3, and the other end of each of the plurality of connecting members 2 is connected with the hoisting member 1. Alternatively, the other end of each of the plurality of connecting members 2 is connected with the hoisting member 1 respectively, and each of the plurality of hoisting members 1 is connected with the hook of the refeeder to hang the device thereon. The number of the connecting members 2 and the manner of connection with the hoisting member 1 are selected according to actual requirements, which are not specifically limited herein.

Since the connecting member 2 is close to the silicon solution when supplementary doping of the dopants 5 are carried out by using the device, in order to ensure that the connecting member 2 has no deformation, no melting, and no adverse effect on quality of the monocrystalline at a high temperature, the material of the connecting member 2 is preferably molybdenum in this embodiment.

The connecting member 2 and the containing member 3 are connected by bolts, so that the containing member 3 can swing relative to the connecting member 2, it is convenient for the dopants 5 to be placed in the containing member 3, and it is also convenient for the connecting member 2 and the containing member 3 to be installed. The bolts are preferably molybdenum bolts 4, so as to ensure that no deformation and melting occurs at high temperatures, and have no adversely effect on quality of the monocrystalline.

The containing member 3 is provided with a first through-hole 7 and a second through-hole 8, and the connecting member and the containing member are connected at a joint. A distance between the first through-hole 7 and the joint is less than a distance between the second through-hole 8 and the joint in the vertical direction, so that the silicon solution enters the containing member 3 from the first through-hole 7 and carries the dopants 5 out of the containing member through the second through-hole 8 when the device is used for supplementary doping, so that the dopants 5 can be placed in the containing member 3 for supplementary doping.

An inner portion of the containing member 3 is divided into a first accommodating cavity and a second accommodating cavity, an upper portion of the first through-hole 7 is the first accommodating cavity, and a lower portion of the first through-hole 7 is the second accommodating cavity. The first accommodating cavity is communicated with the second accommodating cavity, and the second accommodating cavity is used for accommodating the dopants 5. The containing member 3 has a barrel structure, which is convenient for containing the dopants 5. The first through-hole 7 is provided on the side wall of the barrel to divide space in the barrel structure into the first accommodating cavity and the second accommodating cavity, wherein the first accommodating cavity is located at the upper portion of the first through-hole 7, which is convenient for the dopants 5 to enter the second accommodating cavity when filling of the dopants 5, and the second accommodating chamber is located at the lower portion of the first through-hole 7, which is used for containing the dopants 5. The first accommodating cavity is communicated with the second accommodating cavity to facilitate the passage of the dopants 5 into the second accommodating cavity through the first accommodating cavity.

During the supplementary doping, the silicon solution enters from the first through-hole 7 and carries the dopants 5 out from the second through-hole 8. The first through-hole 7 is disposed to allow the silicon solution to enter the containing member 3 from the first through-hole 7 when the containing member is located in the silicon solution, that is, the silicon solution enters the containing member 3 from the first through-hole 7 and is located in the second accommodating chamber. The second through-hole 8 is disposed to allow the silicon solution entering the containing member 3 to flow out from the second through-hole 8, so that the dopants 5 flow out from the second through-hole 8 along with the silicon solution, thereby realizing supplementary doping of the dopants 5.

The containing member 3 is provided with an opening which communicates with the first accommodating chamber, so that the dopants 5 enter the first accommodating chamber from the opening and enters the second accommodating chamber through the first accommodating chamber, that is, the containing member 3 has a barrel structure with an opening at one end, so that the containing member 3 communicates with the outside through the opening to allow the first accommodating chamber to communicate with the outside. The second through-hole 8 is disposed to allow the other end of the containing member 3 to communicate with the outside, so that the dopants 5 flow out of the containing member 3.

The axis of the first through-hole 7 and the axis of the second through-hole 8 may be disposed in parallel, for example, both the first through-hole 7 and the second through-hole 8 are disposed on the side wall of the containing member 3, and the second through-hole 8 is located below the first through-hole 7 (the end of the containing member 3 close to the silicon solution when it is in contact with the silicon solution). Alternatively, the axis of the first through-hole 7 may be intersected with the axis of the second through-hole 8, for example, the first through-hole 7 is located on the side wall of the containing member 3, and the second through-hole 8 is located at the end of the containing member 3 at which the connecting member 2 is not provided. The positions of the first through-hole 7 and the second through-hole 8 are selected according to actual requirements, which are not specifically limited herein. In this embodiment, it is preferable that the axis of the first through-hole 7 intersects the axis of the second through-hole 8.

The axis of the first through-hole 7 intersects the axis of the containing member 3. In this embodiment, the first through-hole 7 is provided on the side wall of the containing member 3. The shape of the first through-hole 7 can be round, square, diamond, elliptical, rounded rectangle with a certain length, or other shapes, which can be selected according to actual requirements, and it is not specifically limited herein. Since the first through-hole 7 is disposed to allow the silicon solution to enter the containing member 3, the first through-hole 7 cannot be disposed at the bottom of the containing member 3 (the end of the containing member 3 contacting with the silicon solution is set as the bottom, and the end connecting with the connecting member 2 is set as the top), so as to prevent the dopants 5 filled in the containing member 3 from flowing out of the first through-hole 7, resulting in accurately supplementary doping cannot be carried out. Therefore, it is necessary that there is a distance between the first through-hole 7 and the second through-hole 8, which is the height of the second accommodating chamber, so as to accommodate the dopants 5.

There are at least two first through-holes 7 symmetrically disposed on the side wall of the containing member 3, so that the silicon solution can enter the containing member 3 from both sides of the containing member 3. Alternatively, there are a plurality of first through-holes 7 disposed in sequence at the same height along the circumferential direction of the side wall of the containing member 3, wherein the plurality of first through-holes 7 may be disposed at equal intervals or at non-equal intervals, which are selected according to actual requirements, and there are no specific limitations herein.

The second through-hole 8 may be disposed on the side wall of the containing member 3. In this case, the second through-hole 8 is located below the first through-hole 7. Alternatively, the second through-hole 8 may be disposed at the bottom of the containing member 3. The position of the second through-hole 8 may be selected according to actual requirements, and there is no specific limitations herein, as long as the dopants 5 can flow out of the second through-hole 8 along with the silicon solution.

The axis of the second through-hole 8 is disposed parallel to the axis of the containing member 3. In this case, the second through-hole 8 is disposed at the bottom of the containing member 3.

There may be at least one or a plurality of second through-holes 8. When there are a plurality of second through-holes 8, the plurality of the second through-holes 8 are disposed in sequence at the same height along the circumferential direction of the containing member 3. The number of the second through-holes 8 is selected according to actual requirements, which is not specifically limited herein.

In this embodiment, the containing member 3 has a barrel structure, and the containing member 3 includes a first barrel and a second barrel connected with each other. One end of the first barrel is connected with the connecting member 2, and the other end of the first barrel is fixedly connected with the second barrel, wherein the fixedly connected manner is preferably integrally formed. The cross-sectional shape of the first barrel may be round, square, elliptical, or other shapes, which can be selected according to actual requirements, and it is not specially limited herein. The space in the first barrel is the first accommodating cavity. The first barrel is connected with the second barrel at a joint where the first through-hole is disposed. The second barrel is used for containing the dopants 5. The space in the second barrel is the second accommodating cavity. In order to enable the dopants 5 to be filled in the second barrel and to rapidly flow out with the silicon solution, the second barrel is shaped as a cone, and one end of which connecting with the first barrel has a diameter larger than that of the other end. The second through hole 8 is disposed at the end with a smaller diameter, so that the dopants 5 can flow out with the silicon solution from the second through-hole 8.

During the supplementary doping process of the doping agents 5, the containing member 3 containing the doping agents 5 is in contact with the silicon solution. Since the containing member 3 is made of quartz, which can withstand a high temperature of above 1400° C., no new impurities will be introduced during the supplementary doping process of the doping agents 5, and the device can be reused, thereby reducing the production cost.

When the device for supplementary doping of monocrystalline silicon alloy is in use, a blocking member 6 is filled in the containing member 3. The blocking member 6 is located at the second through-hole 8, and it has a size larger than that of the second through-hole 8, so that the blocking member 6 can block the second through-hole 8, and the blocking 6 does not leak out of the second through-hole 8. After the blocking member 6 is placed, the dopants 5 are filled in the containing member 3, and the dopants 5 are located in the second containing cavity. Since the second through-hole 8 is blocked by the blocking member 6, the dopants 5 cannot flow out of the second through-hole 8. Further, the second accommodating cavity is located below the first through-hole 7, so the dopants 5 cannot flow out of the first through-hole 7. The above-mentioned blocking block 6 is silicon, so no other impurities can be introduced when the dopants 5 are supplementarily doped. The hoisting member 1 is connected with a hook of a refeeder in the auxiliary room, so as to hang the device in the auxiliary room of a monocrystalline furnace. Lowering the device to be in contact with the silicon solution, and continuing to lower the device so that the device enters into the silicon solution, when the silicon solution receives the position of the first through-hole 7 of the device, stopping lowering the device, and the silicon solution enters the containing member 3 from the first through-hole 7, meanwhile, the blocking member 6 melts under the high temperature of the silicon solution. Lifting the device, so that the silicon solution in the containing member 3 and the dopants 5 flow out from the second through-hole 8, and the dopants 5 enter the silicon solution to carry out supplementary doping.

The present disclosure also relates to a method for supplementary doping of monocrystalline silicon using the above mentioned device for supplementary doping of the dopants 5.

When the above-mentioned device is used for supplementary doping, it is only necessary to hang the above-mentioned device in an auxiliary room of an existing monocrystalline silicon furnace through the hoisting member, thereby reducing cost for equipment modification. Firstly, before supplementary doping, increasing power of a heater in the monocrystalline furnace, increasing a distance from a draft tube to the surface of the silicon solution, and adjusting the position of the draft tube, so as to prevent the surface of the silicon solution from boiling and splashing onto the draft tube. Secondly, before supplementary doping of the dopants 5, the temperature of the silicon solution needs to be adjusted, so that the blocking member 6 located in the device can be rapidly melted when the device is used for supplementary doping. Specifically, when increasing power of the heater, a power variation is increased on the basis of the welding power, which is the welding power set in the czochralski monocrystalline process before supplementary doping the dopants 5. This welding power is the welding power set in the czochralski monocrystalline silicon process before the dopants 5 are doped, which is selected according to the actual setting of each furnace. The power variation ranges from 10 kw to 30 kw. The power variation may be 10 kw, 20 kw, 30 kw, or any power variation between 10 kw to 30 kw, which can be selected according to the actual requirements, and it not specifically limited herein. The increase in the power of the heater is used to increase the temperature of the silicon solution.

The distance between the draft tube and the surface of the silicon solution is increased by a distance variation on the basis of the position of the draft tube before supplementary doping, that is, the draft tube is lifted on the basis of the position of the draft tube before supplementary doping, so that the distance between the draft tube and the surface of the silicon solution is increased. The distance variation ranges from 30 mm to 50 mm, which may be 30 mm, 40 mm, 50 mm, or any distance variation between 30 mm to 50 mm, it is selected according to actual requirements, and there are no specific limitations herein.

Before using the above-mentioned device for supplementary doping, firstly hanging the device in the auxiliary chamber of an existing monocrystalline furnace; and adjusting the temperature of the silicon solution in the quartz crucible to facilitate the subsequent supplementary doping process, which includes steps of:

Filling a blocking member 6 in the second accommodating cavity of the device to block the second through-hole 8. The blocking block 6 is a silicon block, so no new impurities can be introduced in the supplementary doping process of the dopants 5. The blocking member 6 has a larger size than that of the second through-hole 8 of the device, so that the blocking member 6 can block the second through-hole 8 and further seal the second through-hole 8.

Filling the dopants 5: loading the dopants 5 into the containing member according to the need of supplementary doping, wherein the dopants 5 are located in the second accommodating cavity of the device, and the dopants 5 cannot flow out from the second through-hole 8 due to blocking of the blocking member 6.

Hanging the device filled with dopants 5 in the auxiliary room of the monocrystalline furnace, which is specifically carried out by connecting the hoisting member 1 of the device with a hook of a refeeder in the auxiliary room. Lifting the device, so that it is located in the auxiliary room of the monocrystalline furnace and has a certain distance from the monocrystalline furnace, so as to facilitate the subsequent preheating of the device.

Lowering the above-mentioned device and preheating the containing member during the lowering process. Since the material of the containing member 3 of the device is quartz. In order to prevent the containing member from being broken due to excessive temperature difference when contacting with the silicon solution, the containing member needs to be preheated to reduce the temperature difference between the containing member and the silicon solution before the containing member is in contact with the silicon solution, so that the containing member 3 can adapt to the temperature of the silicon solution when contacting with the silicon solution, thereby prolonging the service life of the device. In this step, the device is lowered to a first position above the surface of the silicon solution at a first speed, and the device stays for a period of time for preheating. In the process of lowering the device, the containing member is preheated for the first time, and the temperature of the containing member is gradually increased. Therefore, during the process of lowering the device at the first speed, the containing member is slowly lowered, so that the containing member is sufficiently preheated. The first speed ranges from 500 mm/min to 700 mm/min, and the first speed is selected according to actual requirements and the position of the device in the auxiliary room, which is not specifically limited herein.

When the device is lowered to the first position above the surface of the silicon solution, the containing member stays in the first position for a period of time, and is preheated for a second time, so that the temperature of the containing member is close to the temperature of the silicon solution. Here, the first position is a place where a distance between the containing member and the surface of the silicon solution ranges from 20 mm to 30 mm. The distance may be 20 mm, 25 mm, 30 mm, or any distance between 20 mm and 30 mm, which is selected according to actual requirements, and there is no specific limitations herein. The preheating is carried out for 1 min to 3 min (i.e., time for stopping), which is selected according to actual requirements, and there are no specific limitations herein.

Detecting the temperature of surface of the silicon solution when the temperature of the containing member is close to or equal to the temperature of the silicon solution, and determining that the temperature of surface of the silicon solution reaches a temperature at which the blocking member 6 can be quickly melted. In this step, it is determined that the temperature of surface of the silicon solution is greater than 1460° C. When the temperature of the silicon solution is greater than 1460° C., the blocking member 6 can be quickly melted, so that supplementary doping of the dopants 5 can be rapidly carried out, thereby shortening man-hours for supplementary doping and improving utilization rate of the effective man-hours.

Controlling the position of the containing member for supplementary doping, and controlling the position of the containing member after the temperature of the silicon solution reaches above 1460° C. This step includes:

Continuing the lowering the device, so that the containing member is in contact with the silicon solution, and continuing the lowering the device until the surface of the silicon solution reaches the position of the first through-hole 7, preferably the silicon solution does not exceed an upper side of the first through-hole 7 (the side of the first through-hole 7 close to the top of the containing member 3), so that the silicon solution can flow into the containing member from the first through-hole 7, thus reducing contact areas between the containing member and the silicon solution.

Stopping the containing member in the silicon solution for a first time after the surface of the silicon solution reaches the position of the first through-hole 7. During the first time, the silicon solution enters the containing member and melts the blocking member 6. The first time ranges from 30 s to 120s, which is selected according to actual requirements, and there are no specific limitations herein.

Lifting the device after the blocking member 6 is melted, so that the dopants 5 flow out of the second through-hole 8 along with the silicon solution. During the lifting process, the first through-hole 7 is far away from the surface of the silicon solution, and the silicon solution no longer enters the containing member, meanwhile, the silicon solution carries the dopants 5 out of the second through-hole 8 and enters the silicon solution of the quartz crucible for supplementary doping.

Judging whether there are any dopants 5 remaining in the containing member after the containing member is completely lifted out of the silicon solution, if so, lowering the device again, stopping the containing member in the silicon solution for a first time, lifting the device again, and judging whether there are any dopants 5 remaining in the device, if so, repeating the above steps until all the dopants 5 in the device completely enter the silicon solution of the quartz crucible.

Lifting the device directly into the auxiliary chamber of a monocrystalline furnace if there are no dopants 5 remaining in the device to complete supplementary doping of the dopants 5.

Lifting the device, and slowly cooling the containing member during the lifting process, wherein the containing member is slowly cooled during the lifting process to the auxiliary chamber, so that the temperature of the containing member is gradually reduced to a temperature close to room temperature, so as to facilitate disassembly of the device without cracking due to excessive temperature difference. This step includes:

Lifting the device at a second speed for a second time to reduce the temperature of the containing member: firstly lifting the device at a lower speed, so that the containing member can be slowly cooled. The second speed ranges from 300 mm/hr to 500 mm/hr, and the second time ranges from 1 min to 2 min, which are selected according to actual requirements, and there are no specific limitations herein.

Lifting the device into the auxiliary chamber at a third speed for a third time: lifting the device into the auxiliary chamber of the monocrystalline furnace at a higher speed, so that the temperature of the containing member is slowly lowered after two slowly cooling. The third speed ranges from 500 mm/min to 700 mm/min, and the third time ranges from 3 min to 5 min, which are selected according to actual requirements, and there are no specific limitations herein. The first speed is less than the second speed, and the device is lifted firstly at a low speed and then at a high height during the lifting process.

Reducing power of the heater to the welding power after the device is lifted into the auxiliary chamber of the monocrystalline furnace, so that the temperature of the silicon solution reaches the temperature before supplementary doping, which is convenient for the subsequent process.

Taking the device out to complete supplementary doping, and stabilize the temperature to continue the czochralski monocrystalline silicon.

Effective man-hours by using the existing supplementary doping process range from 3 h to 4 h, while in embodiments of the present disclosure by adopting the above device for supplementary doping, the effective man-hour is only 0.5 h, and utilization rate of the effective man-hours is increased by 83%.

According to the above-mentioned technical solutions, the device for supplementary doping in the alloy is provided with a hoisting member, which can hang the device in the auxiliary room by means of a hook of a refeeder in an auxiliary room of an existing monocrystalline furnace, thereby reducing cost for equipment modification. The device is provided with a containing member for containing the dopants. Meanwhile the containing member is provided with a first through-hole and a second through-hole, a connecting member is connected with the containing member at a joint. A distance between the first through-hole and the joint is less than a distance between the second through-hole and the joint in the vertical direction, so that silicon solution enters the containing member from the first through-hole and carries dopants out of the containing member through the second through-hole for supplementary doping when the device is used for supplementary doping. Further, during the supplementary doping process, temperature of the silicon solution is increased, so that the blocking member and the dopants in the device can be quickly melted, which can effectively save man-hours for supplementary doping and improve utilization rate of the effective man-hours. The material of the containing member of the device is quartz, and the material of the connecting member is metal molybdenum, so that no new impurities can be introduced, thus improving production capacity of the monocrystalline silicon, and effectively reducing the production cost simultaneously. In addition, the device can be recycled, having low investment and remarkable benefits.

Embodiments of the present disclosure have been described in detail above, but the contents are merely preferred embodiments of the disclosure, which are not intended to limit scope of implementation of the present disclosure. All equivalent changes and modifications made in accordance with the scope of the present disclosure shall still fall within the scope of the present disclosure.

What is claimed is:

1. A method for supplementary doping of monocrystalline silicon, comprising:
    lowering a device for supplementary doping of monocrystalline silicon,
    wherein the device for supplementary doping of monocrystalline silicon comprises a hoisting member, two connecting members, and a containing member disposed in sequence from top to bottom in a vertical direction, and wherein the hoisting member is connected with one end of each of the connecting members, and another end of each of the connecting members is movably connected with the containing member by bolts, so that the containing member is rotatable with respect to the connecting members,
    wherein the containing member is provided with a first through-hole and a second through-hole, and each of the connecting members and the containing member are connected at a joint,
    wherein a distance between the first through-hole and the joint is less than a distance between the second through-hole and the joint in the vertical direction,
    wherein the first through-hole is provided to divide space in the containing member into a first accommodating cavity and a second accommodating cavity, and the second accommodating cavity is used for filling dopants, and the second accommodating cavity is in communication with the second through-hole, and
    wherein a blocking member is filled in the containing member, the blocking member is located at the second through-hole, and the blocking member has a size larger than that of the second through-hole, so that the blocking member can block the second through-hole, and the blocking does not leak out of the second through-hole;
    controlling positions of the device for supplementary doping of monocrystalline silicon to immerse the containing member filled with dopants in a silicon solution, and
    when the silicon solution receives the position of the first through-hole of the device, stopping lowering the device;
    pouring the silicon solution into the containing member through the first through-hole;
    melting the blocking member; and
    guiding the silicon solution with the dopants flowing out of the second through-hole for supplementary doping,
    wherein before supplementary doping of the dopants, a power variation is introduced based on a welding power to adjust a temperature of the silicon solution, and a distance between a draft tube in an auxiliary room of a monocrystalline furnace and a surface of the silicon solution is increased by a distance variation on a basis of a position of the draft tube before supplementary doping;
    wherein the welding power being a welding power set in a czochralski monocrystalline silicon process before the dopants are doped, the power variation ranging from 10 kw to 30 kw.

2. The method for supplementary doping of monocrystalline silicon according to claim 1, wherein the lowering a device for supplementary doping of monocrystalline silicon further comprises lowering the device for supplementary doping of monocrystalline silicon at a first speed to a first position above a surface of the silicon solution and staying for a period of time for preheating, and wherein the first position is configured for a distance between the containing member and the surface of the silicon solution ranging from 20 mm to 30 mm, the preheating is carried out for 1 min to 3 min, and the first speed ranges from 500 mm/min to 700 mm/min.

3. The method for supplementary doping of monocrystalline silicon according to claim 1, wherein the controlling positions of the device for supplementary doping of monocrystalline silicon to immerse the containing member filled with dopants in a silicon solution, and when the silicon solution receives the position of the first through-hole of the device, stopping lowering the device comprises:
    contacting the containing member with the silicon solution when the surface of the silicon solution has a temperature greater than 1460° C., and continuing to lower the device for supplementary doping of monocrystalline silicon until the silicon solution can flow into the containing member through the first through-hole;
    allowing the containing member to stay in the silicon solution for a first period, so that the silicon solution enters the containing member and melts the blocking member;
    after the blocking member melting, lifting the device for supplementary doping of monocrystalline silicon, so that the dopants flow out of the second through-hole along with the silicon solution; and
    repeating the above operations until there is no residue of the dopants in the containing member.

4. The method for supplementary doping of monocrystalline silicon according to claim 3, wherein the first period ranges from 30 seconds to 120 seconds.

5. The method for supplementary doping of monocrystalline silicon according to claim 3, wherein the surface of the silicon solution is always below the joint of each of the connecting members and the containing member during an operation of continuing to lower the device for supplementary doping of monocrystalline silicon.

6. The method for supplementary doping of monocrystalline silicon according to claim 1, wherein the blocking member is silicon.

* * * * *